(12) United States Patent
Houle et al.

(10) Patent No.: US 8,611,169 B2
(45) Date of Patent: Dec. 17, 2013

(54) FINE GRANULARITY POWER GATING

(75) Inventors: Robert M. Houle, Williston, VT (US); Steven H. Lamphier, Colchester, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 13/315,604

(22) Filed: Dec. 9, 2011

(65) Prior Publication Data

US 2013/0148455 A1 Jun. 13, 2013

(51) Int. Cl.
*G11C 5/14* (2006.01)

(52) U.S. Cl.
USPC .......................................... 365/226; 365/227

(58) Field of Classification Search
None
See application file for complete search history.

(56) References Cited

U.S. PATENT DOCUMENTS

| | | | |
|---|---|---|---|
| 5,263,002 A | 11/1993 | Suzuki et al. | |
| 5,617,369 A | 4/1997 | Tomishima et al. | |
| 5,668,770 A | 9/1997 | Itoh et al. | |
| 5,729,498 A | 3/1998 | Yih et al. | |
| 5,894,443 A | 4/1999 | Sagoh | |
| 5,901,103 A | 5/1999 | Harris, II et al. | |
| 6,108,255 A | 8/2000 | Ciraula et al. | |
| 6,236,617 B1 | 5/2001 | Hsu et al. | |
| 6,426,890 B1 | 7/2002 | Jasinski et al. | |
| 6,724,648 B2 | 4/2004 | Khellah et al. | |
| 7,061,794 B1 | 6/2006 | Sabharwal et al. | |
| 7,408,829 B2 | 8/2008 | Kuang et al. | |
| 7,447,098 B2 | 11/2008 | Tsukude | |
| 7,489,584 B2 | 2/2009 | Dang et al. | |
| 7,692,964 B1 | 4/2010 | Sabharwal et al. | |
| 7,729,194 B2 | 6/2010 | Zanders | |
| 7,835,212 B2 | 11/2010 | Kuang et al. | |
| 2002/0003743 A1 | 1/2002 | Kunikiyo | |
| 2003/0189849 A1* | 10/2003 | Khellah et al. | ................ 365/200 |
| 2011/0090753 A1 | 4/2011 | Lee et al. | |
| 2012/0087198 A1 | 4/2012 | Nii et al. | |

OTHER PUBLICATIONS

Hua et al., "Distributed Data-Retention Power Gating Techniques for Column and Row Co-Controlled Embedded SRAM," 2005, 6 pages, Proceedings of the 2005 IEEE International Workshop on Memory Technology, Design, and Testing (MTDT).

* cited by examiner

*Primary Examiner* — Hoai V Ho
*Assistant Examiner* — James G Norman
(74) *Attorney, Agent, or Firm* — David A. Cain; Hoffman Warnick LLC

(57) ABSTRACT

An approach for providing fine granularity power gating of a memory array is described. In one embodiment, power supply lines are disposed in a horizontal dimension of the memory array parallel to the word lines that access cells arranged in rows and columns of the array, wherein each of the supply lines are shared by adjacent cells in the memory. Power supply lines that activate a row selected by one of the word lines are supplied a full-power voltage value and power supply lines that activate rows adjacent to the selected row are supplied a half-power voltage value, while the power supply lines of the remaining rows in the memory array are supplied a power-gated voltage value.

22 Claims, 7 Drawing Sheets

FINE GRANULARITY POWER GATING

BACKGROUND

The present invention relates generally to integrated circuit memory devices, and more specifically to providing fine granularity power gating of a memory device.

Power gating an integrated circuit memory device generally relates to reducing leakage power in the memory device during operation. A static random access memory (SRAM) is one example of an integrated circuit memory device in which power gating is used to reduce leakage power. A typical SRAM device includes an array of individual SRAM cells each capable of storing a binary voltage value that represents a logical data bit (e.g., "0" or "1"). Power gating an SRAM device generally entails temporarily turning off blocks of cells in the array that are not in use to reduce the overall leakage power of the integrated circuit. During this temporary shutdown of blocks of SRAM cells in the memory array, these blocks operate at a low power mode or a power-gated mode by receiving a reduced voltage supply that is sufficient to retain data. When the blocks of SRAM cells are required for operation they are activated to operate at a full power mode or an active mode by receiving a full voltage supply. These two modes (i.e., active mode and power-gated mode) are switched at an appropriate time and in a suitable manner to maximize power performance while minimizing impact to performance. Power gating blocks of cells in an SRAM device in this manner facilitates the goal of minimizing leakage power by temporarily cutting power off to selective blocks that are not required in the active mode.

SUMMARY

In one embodiment, there is a device that comprises a memory array comprising a plurality of cells arranged in rows and columns, a plurality of true bit lines each connected to a column of the memory array and a plurality of complement bit lines each forming a differential pair with, and in the same column as one of the plurality of true bit lines. The device further comprises a plurality of word lines each connected to a row of the memory array and a plurality of power supply lines disposed in a horizontal dimension of the memory array parallel to the plurality of word lines. Each of the plurality of power supply lines is shared by adjacent cells in the memory array, wherein power supply lines that activate a row selected by one of the plurality of word lines are at a full-power voltage value and power supply lines that activate rows adjacent to the selected row are at a half-power voltage condition. Cells in other rows and columns in the memory array are at a power-gated voltage value.

In a second embodiment, there is a circuit that comprises a memory array comprising a plurality of cells arranged in rows and columns, a plurality of true bit lines each connected to a column of the memory array and a plurality of complement bit lines each forming a differential pair with, and in the same column as one of the plurality of true bit lines. The memory array further includes a plurality of word lines each connected to a row of the memory array and a plurality of power supply lines disposed in a horizontal dimension of the memory array parallel to the plurality of word lines. Each of the plurality of power supply lines is shared by adjacent cells in the memory array. The circuit further includes a fine granularity power gating device that controls a power supply provided to the plurality of power supply lines disposed in the memory array. The fine granularity power gating device supplies a full-power voltage value to power supply lines to activate a row selected by one of the plurality of word lines, a half-power voltage to power supply lines to rows adjacent to the selected row, and a power-gated voltage value to power supply lines associated with the other rows in the memory array.

DETAILED DESCRIPTION

Figure 1:
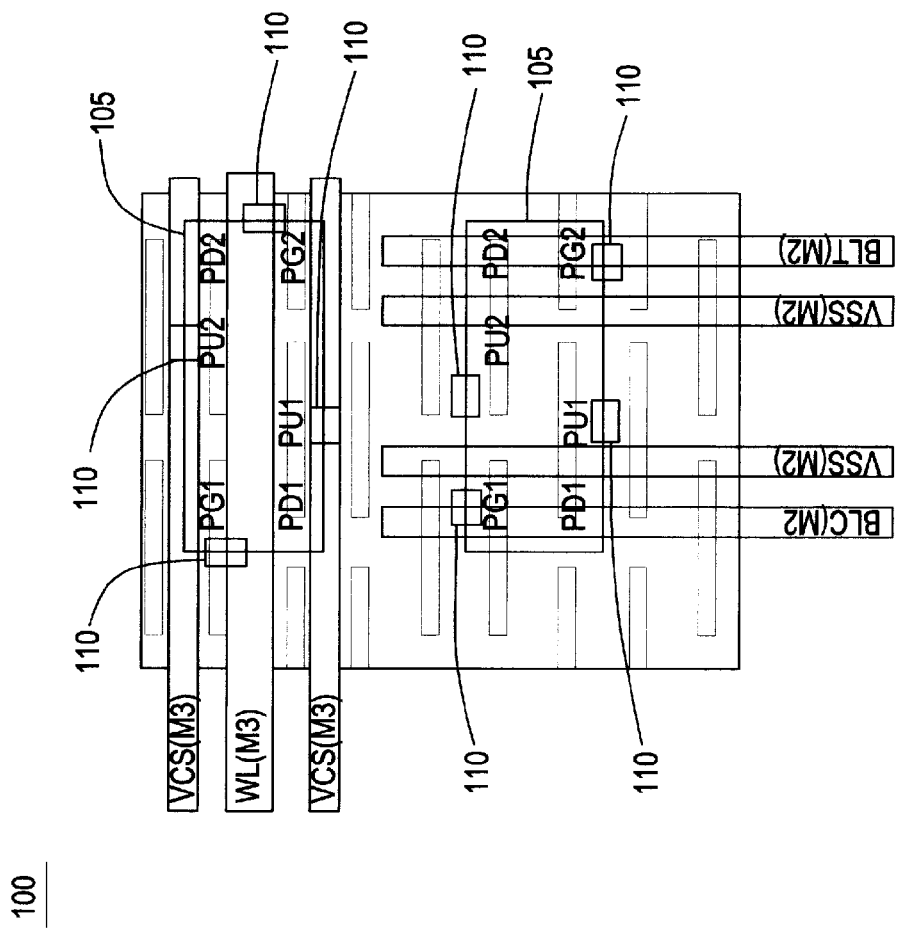
FIG. 1 shows a schematic view of a memory array in which power supply lines associated with cells in banks of the array are disposed in the horizontal dimension and ground power lines are in the vertical dimension according to one embodiment of the present invention.

As mentioned above, power gating an integrated circuit memory device such as, for example, a static random access memory (SRAM), generally entails temporarily turning off blocks of cells in the array that are not in use to reduce the overall leakage power of the integrated circuit. Typical power gating of an SRAM occurs at the bank level of the memory. For example, for a 512 Kbit (Kb) SRAM device built from an array of small banks each having 128 rows×512 bits/row that store a total of 64 Kb, power gating is partitioned throughout eight banks so that one bank receives a full-power value while the other banks received a low-power voltage value or a power-gated voltage value. In such a power gating operation, a decode address will activate any one of these eight banks for reading or writing data via a bank address. Prior to activating a selected bank's word line, the power supply to that bank is charged up so that it is at its full potential (e.g., 1.0 volt), which places the selected bank in an active mode. The power supply lines to the remaining other seven unselected banks remain at a power-gated voltage (e.g., 0.7 volts), which places these banks in a power-gated mode that is sufficient to retain data. When another decode address arrives that activates one of the other banks, then the voltage to the power supply of the previously selected bank reduces to for example, 0.7 volts, placing that bank in the power-gated mode, while the power supply to the newly selected bank is increased to, for example 1.0 volts, placing that bank in the active mode. Power gating an SRAM device in this manner can provide up to 25% in leakage power savings.

Despite the 25% leakage power savings, there are some technical challenges associated with this power gating approach. For example, every time a decode address arrives that selects a new bank for activation, there is some alternating current (AC) power loss associated with waking up that bank by having its power supply line increase the voltage from 0.7 volts to 1.0 volts. The AC power associated with waking up a bank and charging it up from the power-gated mode to the active mode is not negligible despite the 25% leakage power savings. Additionally, the time that is needed to charge up the newly selected bank is not trivial; it takes times to ramp up the voltage supply being provided by its power supply line from 0.7 volts to 1.0 volts. In particular, the selected bank is charged up via transistors that will need to charge up the bank from 0.7 volts to 1.0 volts, and the current required to charge the bank is not generated instantaneously. It takes time to transfer current from a power device external to the memory device to charge up the selected bank across the transistors. Also, decoupling capacitors are often used with the memory device to build a charge reservoir that can be used to charge up the banks of SRAM cells whenever a new decode address arrives that selects a new bank for activation. The use of decoupling capacitors to provide a faster wake-up of banks is not desirable because it results in an area penalty for any such integrated circuits that incorporate these memory devices.

The various embodiments of the present invention set forth a fine granularity approach to power gating that avoids the aforementioned technical challenges and provides up to 55% leakage power savings, which translates to an additional savings in leakage power that is not obtainable with the above-mentioned power gating approach. The various embodiments of the present invention are able to avoid the aforementioned technical challenges and provide up to 55% leakage power savings by disposing power supply lines associated with each of the bitcells (cells) in the banks in a horizontal dimension of the memory array of the banks, such that these power supply lines are parallel to the word lines used to select the cells. In addition, ground lines associated with each of the cells are disposed in a vertical dimension of the memory array parallel to the true bit lines and the complement bit lines that are each connected to a column of the array. By disposing power supply lines, known in the art as $V_{CS}$ lines, in a horizontal dimension of the memory array banks, parallel to the word lines, each of these power supply lines become shared by adjacent cells in the memory. As a result, power supply lines that activate a row selected by one of the word lines are at a full-power voltage value and power supply lines that activate rows adjacent to the selected row are at a half-power voltage value, while cells in other rows and columns in the memory array are at a power-gated voltage value.

In the power gating approach in which the various embodiments of the present invention have improved upon, the $V_{CS}$ power supply lines associated with each of the cells in memory array are disposed in the vertical dimension, while ground power lines of the cells, known in the art as $V_{SS}$ ground power lines, are disposed in a horizontal dimension of the memory array parallel to the word lines. In addition, the $V_{SS}$ ground power lines are shared by adjacent cells in the memory array. In this configuration, every time that a word line is selected, a full row of cells (e.g., 512 cells) in the bank of the memory array that is connected to the word line is activated. As a result of being activated, every one of the $V_{CS}$ power supply lines associated with the cells in the row provide a full power voltage value to the cells in the bank of the memory array. If the $V_{CS}$ power supply lines did not provide a full power voltage value to the cells, then the cells would become unstable and be unable to be read. Because the $V_{CS}$ power supply lines associated with the cells are vertically-disposed throughout the bank of the memory array, all of the other cells in the other rows of this bank will receive a full power voltage value. Consequently, this entire bank or sub-array of the memory array will be fully powered up even though the word line selected one row (note that the other banks in the memory array would be power-gated). As mentioned above, power gating in this manner can provide up to 25% leakage power savings.

By disposing the $V_{CS}$ power supply lines associated with the cells in the horizontal dimension and the $V_{SS}$ ground power lines in the vertical dimension, the various embodiments of the present invention are able to provide a fine granularity power gating approach that provides full power only to a selected row within the bank or sub-array of the memory array and not to all of the rows in the entire bank. FIG. 1 shows a schematic view of a memory array 100 in which the $V_{CS}$ power supply lines associated with the cells are disposed in the horizontal dimension and the $V_{SS}$ ground power lines are in the vertical dimension. In particular, FIG. 1 shows a cell 105 within a bank of memory array 100. For ease of illustrating the embodiments of the present invention, only one cell 105 within a bank of memory array 100 is shown. Those skilled in the art will recognize that the representation of memory array 100 in FIG. 1 would have much more cells 105 arranged in each of the rows and columns in each bank of the array. Although the description that follows for this figure and other figures disclosed herein is directed to a memory array formed from SRAM cells, those skilled in the art will recognize that embodiments described below are also suited for use with other Static memory devices.

Each cell 105, like a typical SRAM cell, includes a balanced pair of cross-coupled inverters storing a single data bit. The balanced pair of cross-coupled inverters is illustrated in FIG. 1 as a pull-up transistors PU1 and PU2 and pull-down transistors PD1 and PD2. Cell 105 further includes a pair of pass gate transistors PG1 and PG2 that selectively connects the complementary outputs of the cross-coupled inverters formed from pull-up transistors PU1 and PU2 and pull-down transistors PD1 and PD2 to a corresponding complementary or differential pair of bit lines (i.e., bit line true (BLT) and bit line complement (BLC)). A word line WL connected to the gates of pass gate transistors PG1 and PG2 selects cell 105 to the corresponding complementary pair of bit lines (BLT and BLC) for performing an operation that may include a read or a write operation. The $V_{CS}$ power supply lines are disposed in the horizontal dimension parallel to, and on both sides of word line WL. As shown in FIG. 1, word line WL connects to pass gate transistors PG1 and PG2 through contacts 110, while the top $V_{CS}$ power supply line connects to pull-up transistor PU2 through contact 110 and the bottom $V_{CS}$ power supply line connects to pull-up transistor PU1 through another contact 110. FIG. 1 further illustrates that the $V_{SS}$ ground power lines are disposed in the vertical dimension parallel to the pair of bit lines BLT and BLC. Bit lines BLT and BLC also connect to pass gate transistors PG1 and PG2 through contacts 110. Note that as an example, the $V_{CS}$ power supply lines and word line WL in the embodiment illustrated in FIG. 1 are disposed in a metal level 3 (M3) of the memory array, while the $V_{SS}$ ground power lines and the pair of bit lines BLT and BLC are disposed in a metal level 2 (M2) of the array.

Those skilled in the art will recognize that cell 105 may include other elements than what is illustrated in FIG. 1. For example, cell 105 may include a sense amplifier for facilitating read operations and a write driver for facilitating write operations.

Figure 2:
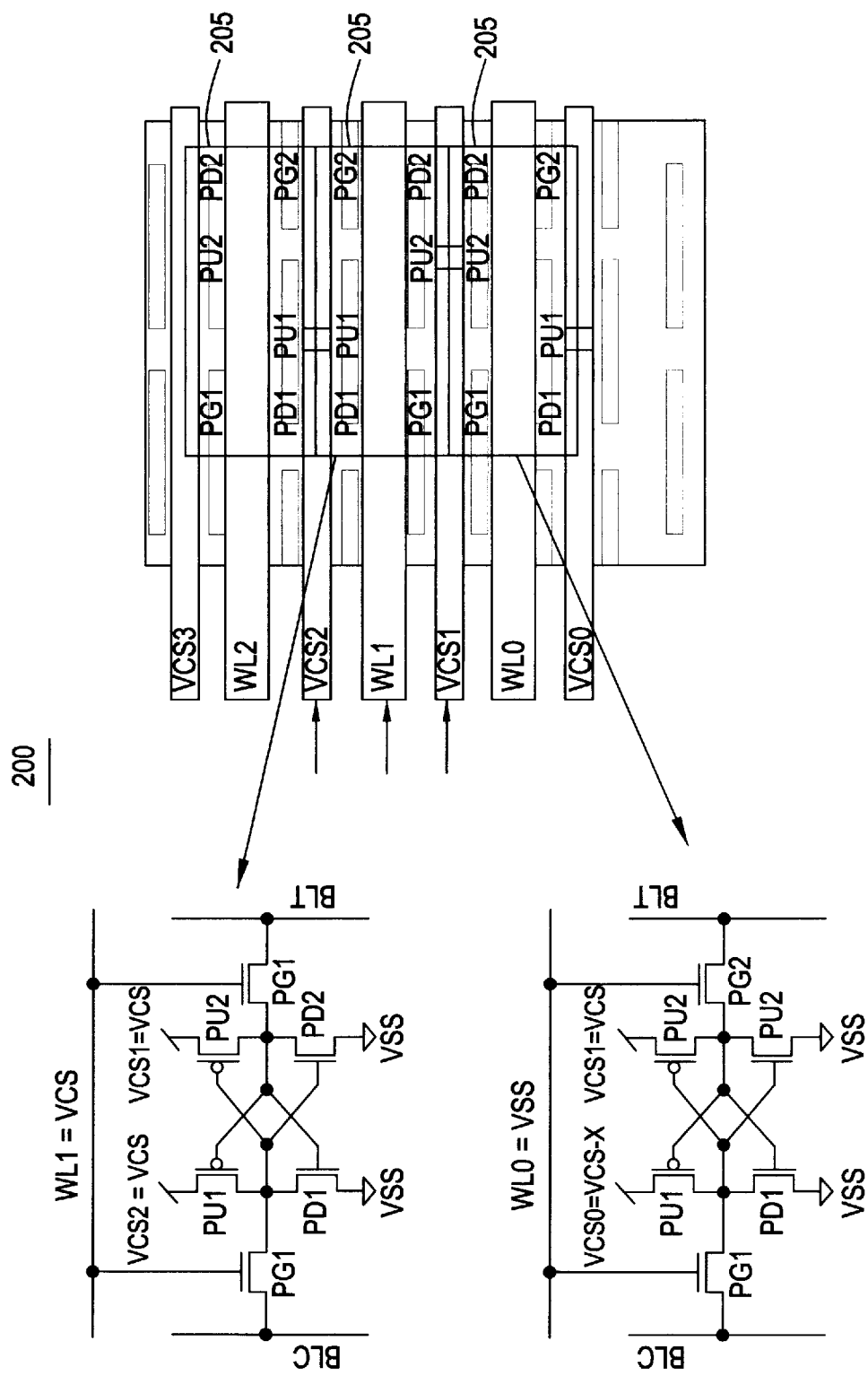
FIG. 2 shows a schematic view of a memory array in which adjacent cells in a bank of the array are configured in the manner depicted in FIG. 1 and are power-gated according to an embodiment of the present invention.

FIG. 2 shows a schematic view of a memory array 200 in which adjacent cells in a bank of the array are configured in the manner depicted in FIG. 1 and are power gated according to an embodiment of the present invention. The right-hand side of FIG. 2 shows three cells 205 in a bank of memory array 200. Each cell 205 is illustrated with the balanced pair of cross-coupled inverters formed from pull-up transistors PU1 and PU2 and pull-down transistors PD1 and PD2. Each cell 205 further includes a pair of pass gate transistors PG1 and PG2 that selectively connects the complementary outputs of the cross-coupled inverters formed from pull-up transistors PU1 and PU2 and pull-down transistors PD1 and PD2. A word line WL is connected to the gates of pass gate transistors PG1 and PG2 for each cell 205. As shown in FIG. 2, word line WL0 is used to select the bottom cell 205 in that row of the array for activation, word line WL1 is used to select the middle cell 205 in that row of the array for activation, and word line WL2 is used to select the top cell 205 in that row of the array for activation.

The $V_{CS}$ power supply lines for each cell 205 are disposed in the horizontal dimension parallel to the word lines. As shown in FIG. 2, $V_{CS0}$ power supply line provides power to the bottom cell 205, $V_{CS1}$ power supply line provides power to the middle cell 205, $V_{CS2}$ power supply line provides power to the top cell 205, and $V_{CS3}$ power supply line provides power to another cell (not illustrated in FIG. 2) adjacent the top cell 205. FIG. 2 shows that each of the power supply lines for a given cell 205 is shared by adjacent cells in memory 205. In particular, $V_{CS0}$ power supply line is shared by bottom cell 205 and another cell (not illustrated in FIG. 2) below and adjacent the bottom cell, $V_{CS1}$ power supply line is shared by the middle cell 205 and the bottom cell 205, $V_{CS2}$ power supply line is shared by the top cell 205 and the middle cell 205, and $V_{CS3}$ power supply line is shared by top cell 205 and another cell (not illustrated in FIG. 2) adjacent and above the top cell.

The right-hand side of FIG. 2 shows that the middle cell 205 in a bank of memory array 200 has been selected as indicated by the presence of the arrows directed to word line WL1. Power supply lines $V_{CS1}$ and $V_{CS2}$ are activated as indicated by the presence of the arrows directed thereto because these lines are used to supply power to the selected middle cell 205. As a result, power supply lines $V_{CS1}$ and $V_{CS2}$ provide a full-power voltage value to the row in the bank of memory that corresponds with word line WL1. Word lines WL0 and WL2 are not selected, however, because one of their power supply lines are shared by a line used to activate an adjacent cell selected by word line WL1, the cells that correspond respectively with word lines WL0 and WL2 will receive a half-powered voltage condition. In particular, power supply lines $V_{CS1}$ and $V_{CS0}$ correspond with word line WL0 and power supply lines $V_{CS3}$ and $V_{CS2}$ correspond with word line WL2. Because power supply lines $V_{CS1}$ and $V_{CS2}$ are active and providing a full-power voltage, while power supply lines $V_{CS0}$ and $V_{CS3}$ are not, the rows containing these adjacent cells will receive a half-power voltage condition. Note that in this scenario that the rows containing cells above top cell 205 and rows containing cells below bottom cell 205 would be power-gated to receive a power-gated voltage.

The top portion and bottom portion on the left-hand side of FIG. 2 illustrate what happens at a circuit level of the cells illustrated on the right-hand side of the figure. In particular, the top portion on the left-hand side of FIG. 2 illustrates the operation of the middle cell 205 at the circuit level when it is selected. As shown in the top portion on the left-hand side of FIG. 2, when word line WL1 is selected it receives a full-powered voltage value equal to a voltage $V_{CS}$. Power supply lines $V_{CS1}$ and $V_{CS2}$ are also shown as being equal to voltage $V_{CS}$ because of their association with word line WL1. In operation, WL1 is applied to pass gate transistors PG1 and PG2 to selectively connect the complementary outputs of the cross-coupled inverters formed from pull-up transistors PU1 and PU2 connected to power supply lines $V_{CS1}$ and $V_{CS2}$ and pull-down transistors PD1 and PD2 connected ground power line $V_{SS}$.

The bottom portion of the left-hand side of FIG. 2 illustrates the operation of the bottom cell 205 at the circuit level when the middle cell 205 is selected. In the scenario illustrated in FIG. 2, word line WL0 is not selected, however, it receives a half-power voltage condition because it is adjacent the middle cell 205 which has been selected. Because word line WL0 is not selected it supplied a voltage $V_{SS}$ from the ground power line As shown in the bottom portion of the left-hand side of FIG. 2, power supply line $V_{CS1}$ is equal to voltage $V_{CS}$ because it is powered to activate the adjacent cell selected by word line WL1. Power supply line $V_{CS0}$ is equal to voltage $V_{CS}$ minus X, which equals a power-gated voltage (e.g., 0.7 volts) because it is in a power-gated mode. Although not illustrated, a circuit schematic of the top cell 205 would be similar to the one illustrated for the bottom cell in the scenario when middle cell 205 is activated.

Figure 3:
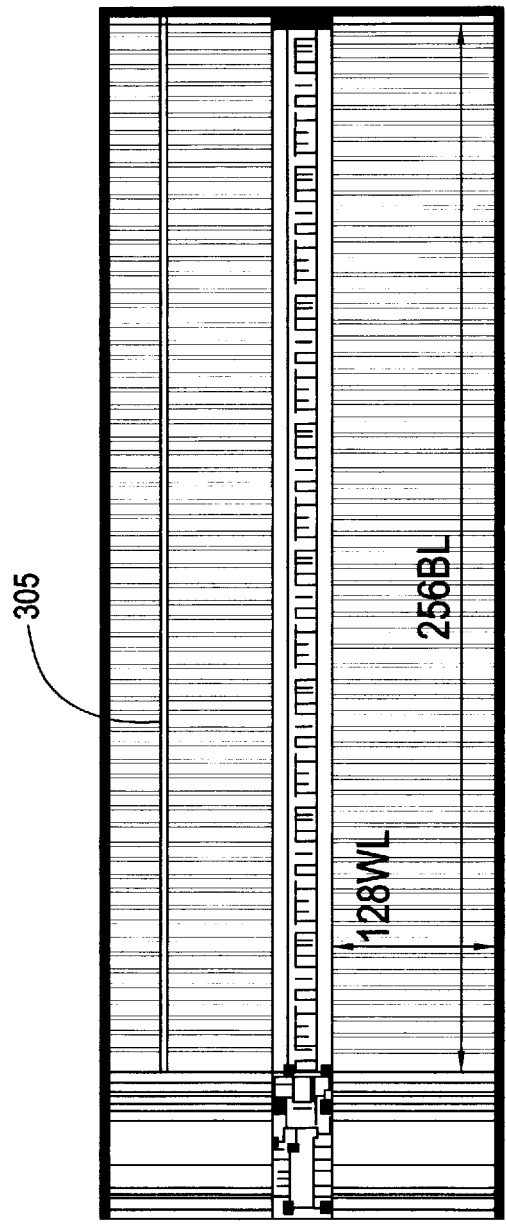
FIG. 3 shows a schematic diagram illustrating the leakage power savings in a bank of a memory array that is attained by using the power gating approach described according to one of the various embodiments of the present invention.

FIG. 3 shows a schematic diagram illustrating the leakage power savings in a bank 300 of a memory array that is attained by using the power gating approach depicted in FIG. 2. In particular, FIG. 3 shows that only one row 305 in the bank is at full power, while all of the other remaining rows in the banks are not at full power, but at a power-gated voltage. Note that for clarity, the only row in bank 300 that is clearly illustrated is row 305 because it is at full power. The other rows, which would take up the remaining space in bank 300 are not illustrated in this figure. In FIG. 3, bank 300 is shown as including 128 rows×256 bits/row that store a total of 32 Kb. Those skilled in the art will recognize that for a bank that includes 128 rows×512 bits/row that store a total of 64 Kb, the bank illustrated in FIG. 3 is only partially portrayed as a half-bank. In reality, there would be a mirror of the bank extending from the left-hand side of bank 300. In any event, for this example illustrated in FIG. 3, only row 305 is highlighted as being full-powered. Of the other remaining rows, 125 rows would be at a power-gated voltage and the two rows adjacent to row 305 would be at a half-power voltage.

As mentioned above, if the $V_{CS}$ power supply lines associated with the cells were vertically-disposed throughout the bank as in the approach that the various embodiments of the present invention seek to improve upon, then all of the columns of this bank would be highlighted as receiving a full-power voltage. The fine granularity power gating approach that is provided by the various embodiments of the present invention that provides full power only to a selected row within the bank as opposed to all of the columns in the bank can provide up to a 30% improvement in leakage power savings over the earlier described power gating approach that the embodiments of the present invention seek to improve upon.

Figure 4:
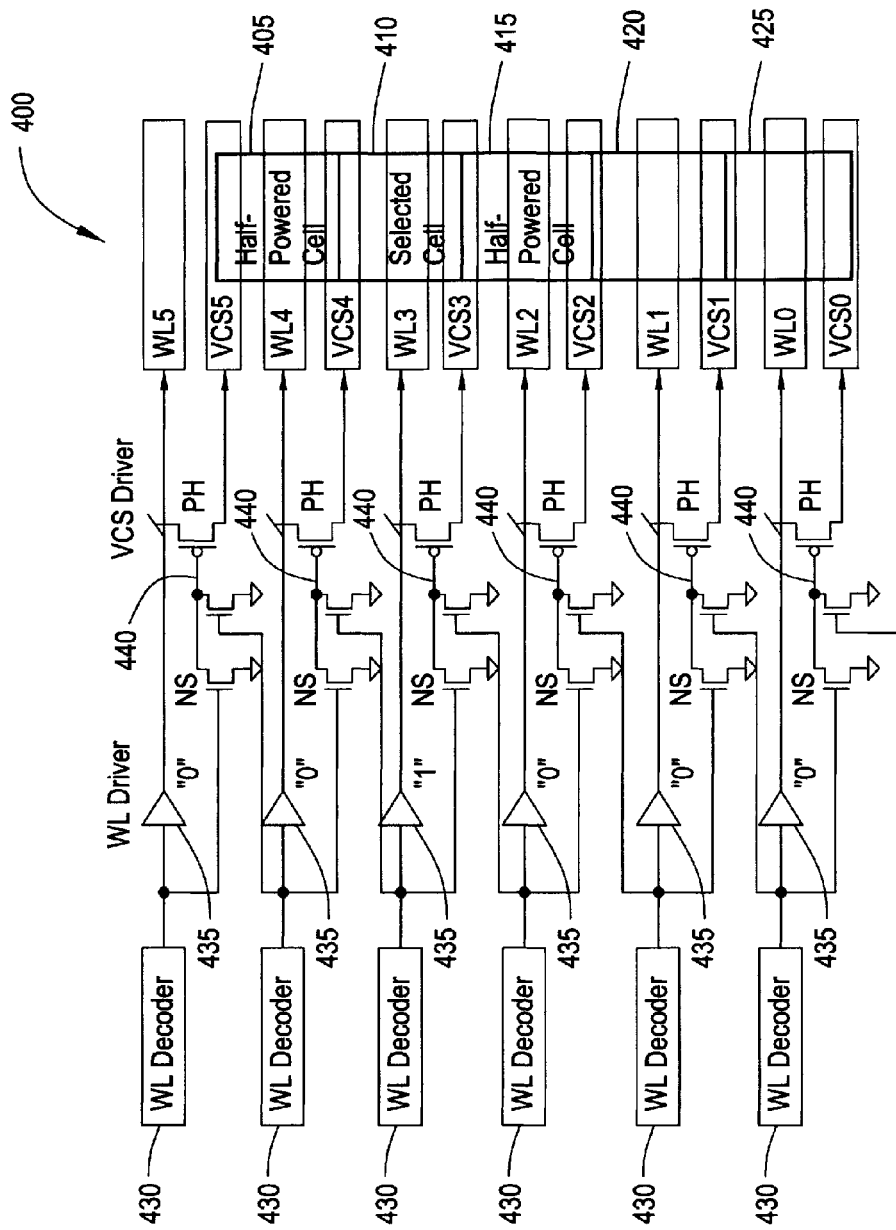
FIG. 4 shows a schematic illustrating a single row decoding scheme for power gating a memory array according to one embodiment of the present invention.

FIG. 4 shows a schematic illustrating a single row decoding scheme for power gating a memory array 400 according to one embodiment of the present invention. For clarity, memory array 400 represents only part of a bank in the array. Those skilled in the art will appreciate that the bank would have more cells than what is illustrated in FIG. 4 as well as more banks than what is represented in this figure. As shown in FIG. 4, memory array 400 includes five cells 405, 410, 415, 420 and 425 located in different rows of the bank. Each cell is selected for activation by a respective word line. In particular, word line WL0 selects cell 425 for activation, word line WL1 selects cell 420 for activation, word line WL2 selects cell 415 for activation, word line WL3 selects cell 410 for activation, word line WL4 selects cell 405 for activation. Each cell includes $V_{CS}$ power supply lines for providing power to its respective rows. In particular, $V_{CS0}$ and $V_{CS1}$ power supply lines provides power to cell 425, $V_{CS1}$ and $V_{CS2}$ power supply lines provides power to cell 420, $V_{CS2}$ and $V_{CS3}$ power supply lines provides power to cell 415, $V_{CS3}$ and $V_{CS4}$ power supply lines provides power to cell 410, and $V_{CS4}$ and $V_{CS5}$ power supply lines provides power to cell 405.

As illustrated in FIG. 4, cell 410 has been selected by word line WL3 for activation. Consequently, $V_{CS3}$ and $V_{CS4}$ power supply lines provides a full-power voltage value to cell 410. Because cells 405 and 415 are adjacent to cell 410, these cells will receive a half-powered voltage condition due to each having one power supply line active (i.e., $V_{CS3}$ and $V_{CS4}$ power supply lines) and one power supply line not active (i.e., $V_{CS2}$ and $V_{CS5}$ power supply lines). In this example, the power supply lines for cells 420 and 425 would provide these cells with a power-gated voltage because their respective word lines WL0 and WL1 have not been selected.

In FIG. 4, a word line decoder (WL Decoder) 430 is connected to each of the word lines (i.e., WL0, WL1, WL2, WL3, WL4, and WL5) through a word line driver (WL Driver) 435. The word line decoders 430 represent logic that is used to select a particular word line for activation of a row in memory array 400. As shown in FIG. 4, only one word line decoder 430 and word line driver 435 are in a select state (represented by a "1") that activates a cell (i.e., cell 410). The other word line decoders 430 and word line drivers 435 are in an inactive state (represented by a "0"), and thus do not select any of the other cells (i.e., cells 405, 415, 420 and 425).

In addition to selecting word lines, word line decoders 430 include logic that activate the various power supply lines (i.e., $V_{CS0}$, $V_{CS1}$, $V_{CS2}$, $V_{CS3}$, $V_{CS4}$, and $V_{CS5}$) via power supply line drivers ($V_{CS}$ Driver) 440. As shown in FIG. 4, each power supply line driver 440 comprises a header device formed from field effect transistors (FETs). In one embodiment, each header device may include a P-type field effect transistor (PFET) header (PH) coupled to one of the $V_{CS}$ power supply lines and a pair of N-type field effect transistor (NFET) select headers (NS) coupled to a gate of PH. In this configuration, a first NFET in NS couples to a word line decoder 430 that activates a row powered by the power supply line and a second NFET in NS is coupled to an adjacent word line decoder. For example, consider the power supply line driver 440 that powers the power supply lines associated with word line WL3 (i.e., $V_{CS3}$ and $V_{CS4}$ power supply lines). In order to select word line WL3 for activation, the gate of PH will be at ground to activate this transistor. The gate of PH can be placed at ground by either the word line decoder 430 that selects word line WL3 or an adjacent word line decoder (e.g., the decoder that selects word line WL2 for activation). Thus, the configuration of FIG. 4 provides the structure that facilitates selection of each $V_{CS}$ power supply line by a word line decoder 430 associated with that power supply line for a given row, as well as selection by an adjacent word line decoder associated with an adjacent row. As a result, every time it is desirable to select a row, a word line decoder 430 for that row shall select a PH for that row and a PH for an adjacent neighboring cell.

In this embodiment, the word line decoders 430, word line drivers 435 and the power supply line drivers 440 operate collectively to provide a fine granularity power gating device that is capable of providing 55% leakage power savings.

Figure 5:
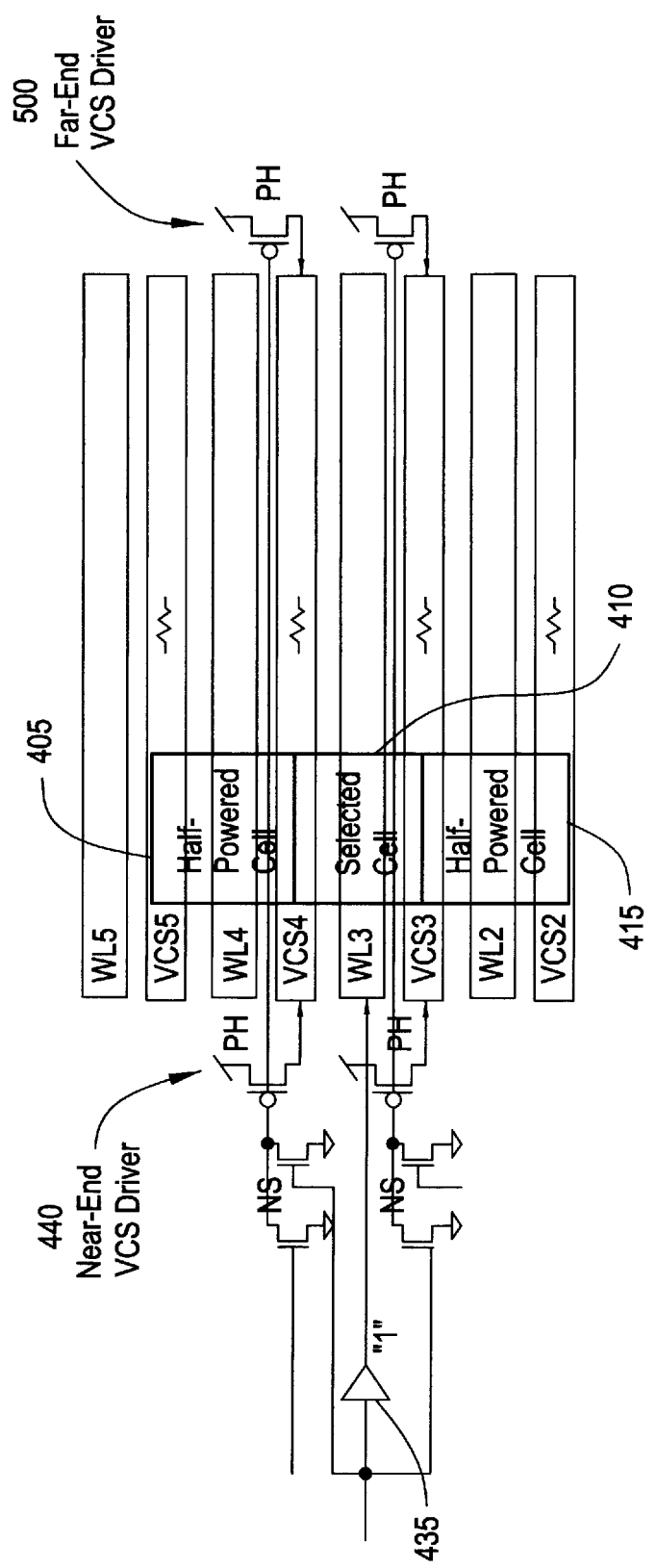
FIG. 5 illustrates a power supply line buffering scheme that provides a far-end power supply driver at far-ends of the power supply lines depicted in FIG. 4 according to one embodiment of the present invention.

As pointed out in FIG. 3, the length of a given row in bank of memory can be quite long. As a result, the length of a given row can create a propagation delay in charging up a $V_{CS}$ power supply line. The power supply line drivers 440 depicted in FIG. 4, which are located a near-end of the $V_{CS}$ power supply lines, may not be sufficient to charge up the lines at their far-ends because of the resistive nature of the lines. The resistive nature of the $V_{CS}$ power supply lines can result in cell node charge-up that can cause substantial droop at the far-end of the lines. Consequently, the half-powered cells that arise during the power gating described in FIG. 4 may be disturbed by this droop. FIG. 5 describes a $V_{CS}$ power supply line buffering scheme that provides a far-end power supply driver (Far-End $V_{CS}$ Driver) 500 at the far-ends of the $V_{CS}$ power supply lines that assists with the charging of the lines. As shown in FIG. 5, each far-end power supply driver 500 is coupled to the power supply lines at an end opposite the coupling of the lines to power supply line drivers (Near End VCS Drivers) 440. In one embodiment, as shown in FIG. 5, each far-end power supply driver 500 comprise a PH transistor that mirrors the PH transistor placed at the near-end of the power supply lines. For clarity, FIG. 5 only shows PH transistors associated with selected cell 410 and one of the half-powered cells 415. Those skilled in the art will appreciate that the other cells depicted in FIG. 4, although not depicted in FIG. 5 would have similar PH transistors as the far-end power supply driver 500.

Figure 6:
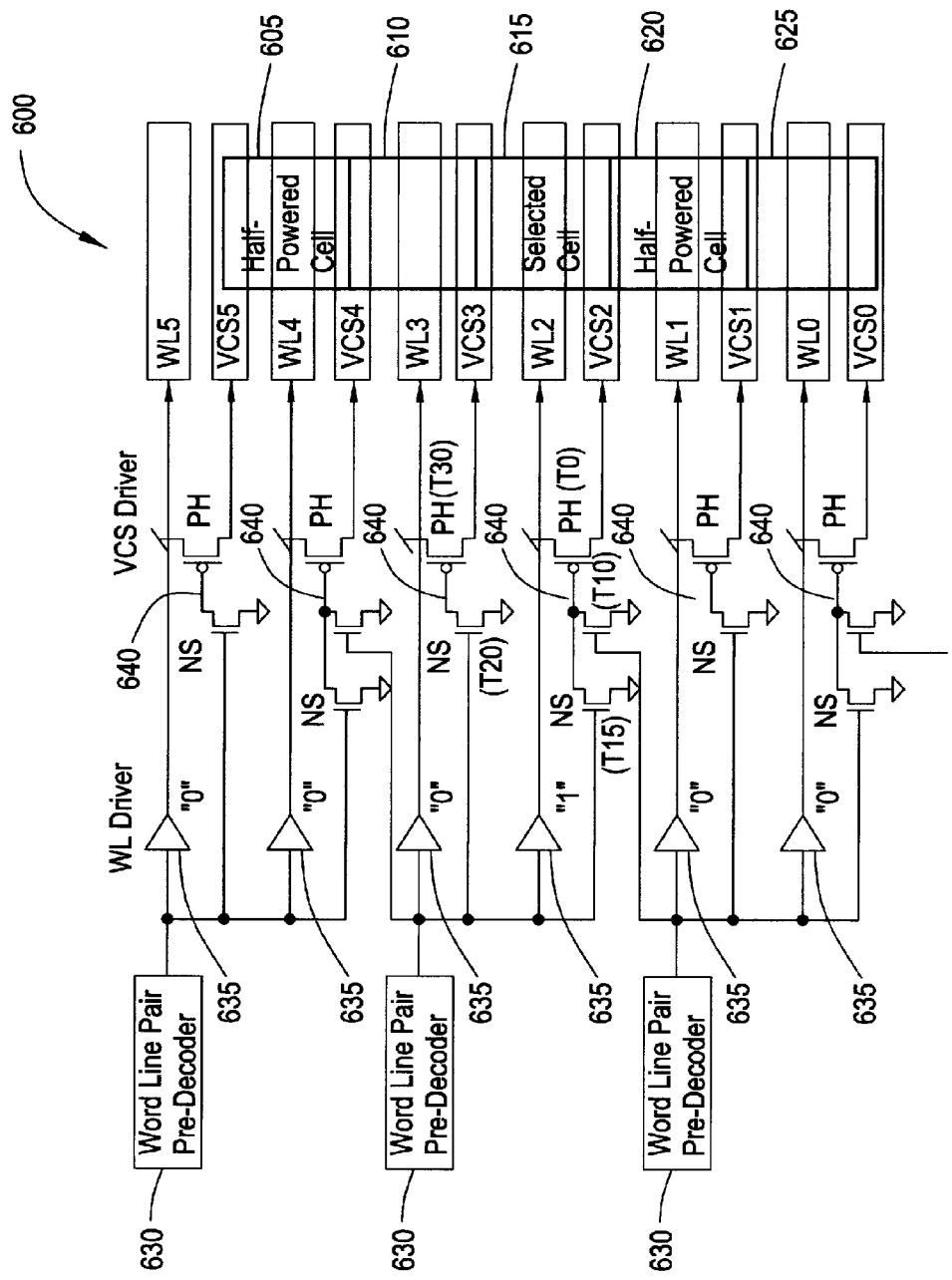
FIG. 6 shows a schematic illustrating a decoding scheme for power gating a pair of rows in a memory array according to one embodiment of the present invention.

FIG. 6 shows a schematic illustrating a decoding scheme for power gating a pair of rows in a memory array 600 according to one embodiment of the present invention. For clarity, memory array 600 represents only part of a bank in the array. Those skilled in the art will appreciate that the bank would have more cells than what is illustrated in FIG. 6 as well as more banks than what is represented in this figure. As shown in FIG. 6, memory array 600 includes five cells 605, 610, 615, 620 and 625 located in different rows of the bank. Each cell is selected for activation by a respective word line. In particular, word line WL0 selects cell 625 for activation, word line WL1 selects cell 620 for activation, word line WL2 selects cell 615 for activation, word line WL3 selects cell 610 for activation, word line WL4 selects cell 605 for activation. Each cell includes $V_{CS}$ power supply lines for providing power to its respective rows. In particular, $V_{CS0}$ and $V_{CS1}$ power supply lines provides power to cell 625, $V_{CS1}$ and $V_{CS2}$ power supply lines provides power to cell 620, $V_{CS2}$ and $V_{CS3}$ power supply lines provides power to cell 615, $V_{CS3}$ and $V_{CS4}$ power supply lines provides power to cell 610, and $V_{CS4}$ and $V_{CS5}$ power supply lines provides power to cell 605.

In FIG. 6, a word line pair pre-decoder 630 is connected to a pair of word lines for selection of a pair of cells in the rows of memory array 600. For each pair of word lines that can be selected, word line pair pre-decoder 630 is also connected to the power supply lines associated with the pair of word lines. In FIG. 6, the bottom word line pair pre-decoder 630 connects to word line WL0 of cell 625 and word line WL1 of cell 620, the middle word line pair pre-decoder 630 connects to word line WL3 of cell 610 and word line WL2 of cell 615, and the top word line pair pre-decoder 630 connects to word line WL4 of cell 605 and word line WL5 of another cell adjacent to cell 605 that is not illustrated in this figure.

Word line pair pre-decoder 630 further includes logic for connecting to the $V_{CS}$ power supply lines associated with each pair of word lines that it selects. In FIG. 6, bottom word line pair pre-decoder 630 connects with $V_{CS0}$, $V_{CS1}$ and $V_{CS2}$ power supply lines, middle word line pair pre-decoder 630 connects with $V_{CS2}$, $V_{CS3}$ and $V_{CS4}$ power supply lines, and top word line pair pre-decoder 630 connects with $V_{CS4}$, $V_{CS5}$ power supply lines and another $V_{CS}$ power supply line associated above and adjacent to cell 605 that is selected upon selection of word line WL5. In this configuration, each word line pair pre-decoder 630 is configured to select power supply lines that provide power to the pair of word lines that are selected by that pre-decoder. In addition, each word line pre-decoder 630 is configured to select a power supply line associated with a word line that is adjacent to one of the pair of word lines that are selected by a neighboring pre-decoder. In particular, bottom word line pair pre-decoder 630 connects with $V_{CS2}$ power supply line which powers cell 615 and cell 620 which is selected by middle word line pair pre-decoder 630. Middle word line pair pre-decoder 630 connects with $V_{CS4}$ power supply line which powers cell 610 and cell 605 which is selected by top word line pair pre-decoder 630.

Each word line pair pre-decoder 630 is connected to a pair of word lines for selection and activation through a pair of word line drivers (WL Driver) 635. As shown in FIG. 6, only one word line pair pre-decoder 630 (i.e., the middle word line pair pre-decoder) and word line driver 635 are in a select state (represented by a "1") that activates a cell (i.e., cell 615). The other word line pair pre-decoders 630 and word line drivers 635 are in an inactive state (represented by a "0"), and thus do not select any of the other cells (i.e., cells 605, 610, 620 and 625).

In addition to including logic for selecting word lines, word line pair pre-decoders 630 include logic that activates the various power supply lines (i.e., $V_{CS0}$, $V_{CS1}$, $V_{CS2}$, $V_{CS3}$, $V_{CS4}$, and $V_{CS5}$) via power supply line drivers ($V_{CS}$ Driver) 640. Each power supply line driver 640 enables the word line pair pre-decoders 630 to select their respective $V_{CS}$ power supply lines in the manner described above. In particular, bottom word line pair pre-decoder 630 connects with $V_{CS0}$, $V_{CS1}$ and $V_{CS2}$ power supply lines through a power supply line driver 640, middle word line pair pre-decoder 630 connects with $V_{CS2}$, $V_{CS3}$ and $V_{CS4}$ power supply lines through a power supply line driver 640, and top word line pair pre-decoder 630 connects with $V_{CS4}$, $V_{CS5}$ power supply lines through a power supply line driver 640 and another $V_{CS}$ power supply line associated above and adjacent to cell 605 that is selected upon selection of word line WL5.

In the embodiment illustrated in FIG. 6, cell 615 has been selected by word line WL2 for activation by middle word line pair pre-decoder 630 through a power supply line driver 640. Consequently, $V_{CS2}$ and $V_{CS3}$ power supply lines are selected to provide a full-power voltage value to cell 615. Because each word line pair pre-decoder is configured to select a pair of word lines, middle word line pair pre-decoder 630 will select the power supply lines associated with cell 610 (i.e., $V_{CS3}$ and $V_{CS4}$ power supply lines) even though word line WL3 was not selected. Since cells 605 and 620 are adjacent to cells 610 and 615, these cells will receive a half-powered voltage due to each having one power supply line active (i.e., $V_{CS2}$ and $V_{CS4}$ power supply lines) and one power supply line not active (i.e., $V_{CS1}$ and $V_{CS5}$ power supply lines). The power supply lines for cell 625 and the cell above and adjacent to cell 605 would provide these cells with a power-gated voltage because their respective word lines WL0 and WL5 have not been selected.

Using each word line pair pre-decoder 630 to connect to a pair of word lines and their respective $V_{CS}$ power supply lines enables this embodiment to be more area efficient than the embodiment illustrated in FIG. 4. In particular, there are fewer components associated with the power supply line drivers 640 shown in FIG. 6 as opposed to the power supply line drivers 440 shown in FIG. 4. As shown in FIG. 6, each power supply line driver 640 comprises a header device formed from FETs. In one embodiment, each header device may include a PFET header (PH) coupled to one of the $V_{CS}$ power supply lines and at least one NFET headers (NS) coupled to a gate of PH. In one embodiment as shown in FIG. 6, the power supply line driver 640 associated with even numbered $V_{CS}$ power supply lines (i.e., $V_{CS0}$, $V_{CS2}$, $V_{CS4}$) includes more NS transistors than the power supply line drivers 640 associated with odd numbered $V_{CS}$ power supply lines (i.e., $V_{CS1}$, $V_{CS3}$, $V_{CS5}$).

As shown in FIG. 6, power supply line drivers 640 associated with even numbered $V_{CS}$ power supply lines (i.e., $V_{CS0}$, $V_{CS2}$, $V_{CS4}$) includes two NFETs. A first NFET in NS couples to a word line pair pre-decoder 630 that is used to activate a row powered by that even-numbered power supply line and a second NFET in NS is coupled to an adjacent word line pair pre-decoder. For example, consider the power supply line driver 640 that powers the $V_{CS2}$ power supply line associated with word line WL2. One of the NFETs in that power supply line driver 640 is used in conjunction with the PH in that driver to select the $V_{CS2}$ power supply line for activation in response to receiving instructions from the middle word line pair pre-decoder 630. The other NFET in that power supply line driver 640 is used in conjunction with the PH in that driver to select the $V_{CS2}$ power supply line for activation in response to receiving instructions from the bottom word line pair pre-decoder 630.

Power supply line drivers 640 associated with odd numbered $V_{CS}$ power supply lines (i.e., $V_{CS1}$, $V_{CS3}$, and VCS5) includes one NFET. This NFET couples to the word line pair pre-decoder 630 that is used to activate a row powered by that odd-numbered power supply line. For example, consider the power supply line driver 640 that powers the $V_{CS3}$ power supply line associated with word lines WL2 and WL3. This NFET in that power supply line driver 640 is used in conjunction with the PH in that driver to select the $V_{CS3}$ power supply line for activation in response to receiving instructions from the middle word line pair pre-decoder 630 and no other decoders. Thus, with this configuration, odd and even numbered $V_{CS}$ power supply lines are selectable by a respective word line pair pre-decoder 630 associated with that pair of word lines, and the even numbered $V_{CS}$ power supply lines are further selectable by an adjacent word line pre-decoder.

For an example illustrating the operation of the schematic shown in FIG. 6, consider the power supply line drivers 640 that powers the power supply lines ($V_{CS2}$ and $V_{CS3}$ power supply lines) associated with word line WL2. In order to select word line WL2 for activation, the gates of the PH transistors for these power supply line drivers will be at ground to activate these transistors. The gate of the PH transistor for the even-numbered $V_{CS}$ power supply line ($V_{CS2}$ power supply line) can be placed at ground by either the word line pair pre-decoder 630 that selects word line WL2 or an adjacent word line pair pre-decoder (i.e., the bottom word line pair pre-decoder that selects word line WL1 for activation). On the other hand, the gate of the PH transistor for the odd-numbered $V_{CS}$ power supply line ($V_{CS3}$ power supply line) can be placed at ground by the word line pair pre-decoder 630 that selects word line WL2 (i.e., the middle word line pair pre-decoder) for activation.

The other word line (i.e., word line WL3) that is selected by the middle word line pair pre-decoder 630 and its respective $V_{CS}$ power supply lines ($V_{CS3}$ and $V_{CS4}$) would be activated in a similar manner but with top word line pair pre-decoder 630. In particular, in order to select word line WL3 for activation, the gates of the PH transistors for these power supply line drivers will be at ground to activate these transistors. The gate of the PH transistor for the even-numbered $V_{CS}$ power supply line ($V_{CS4}$ power supply line) can be placed at ground by either the middle word line pair pre-decoder 630 that selects word line WL3 or an adjacent word line pair pre-decoder (i.e., the top word line pair pre-decoder that selects word line WL4 for activation). On the other hand, the gate of the PH transistor for the odd-numbered $V_{CS}$ power supply line ($V_{CS3}$ power supply line) can be placed at ground by the word line pair pre-decoder 630 that selects word line WL2 (i.e., the middle word line pair pre-decoder) for activation.

Those skilled in the art will recognize that the use of two NFETs for even-numbered $V_{CS}$ power supply lines and one NFET for odd-numbered $V_{CS}$ power supply lines is illustrative of an example how one could reduce the number of transistors used in the power supply line drivers 640 and is not meant to be limiting. For example, it is possible that the power supply line drivers 640 for odd-numbered $V_{CS}$ power supply lines could have more transistors than for the power supply line drivers associated with even-numbered $V_{CS}$ power supply lines. Furthermore, the number of transistors used in each of the power supply line drivers 640 for both the even and odd numbered $V_{CS}$ power supply lines is only example and is not meant to be limiting.

In addition, those skilled in the art will recognize that word line pair pre-decoders 630 are not limited to being used to select and activate only one pair of word lines as illustrated in FIG. 6. Instead, word line pair pre-decoders 630 can be configured to select and activate more than one pair of word lines. For example, word line pair pre-decoders 630 can be used to select pairs that activate 4 rows, 8 rows, etc. The more rows selected and activated by a word line pair pre-decoder 630 will result in power supply line drivers 640 having less transistors (e.g., less NFETs connect to PFET headers) in use, which translates into further area reduction.

In this embodiment, the word line pair pre-decoders 630, word line drivers 635 and the power supply line drivers 640 operate collectively to provide a fine granularity power gating device that is capable of providing 55% leakage power savings.

Figure 7:
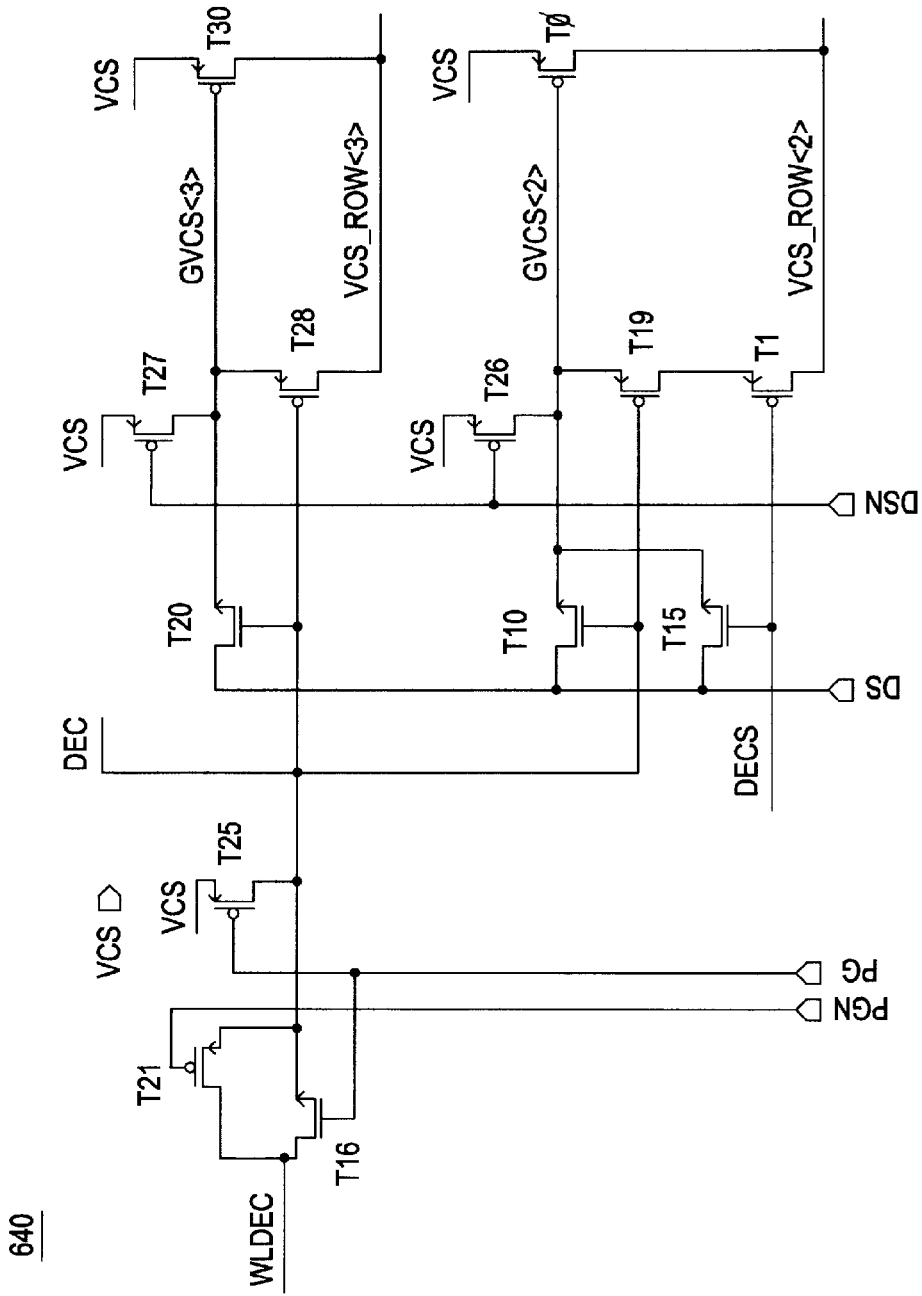
FIG. 7 is a circuit level view of a power supply line driver depicted in FIG. 6 according to one embodiment of the present invention.

FIG. 7 is a more detailed view of a power supply line driver 640 depicted in FIG. 6 at a circuit level according to one embodiment of the present invention. In particular, FIG. 7 shows a circuit schematic of the headers (PHs and PSs) associated with the power supply line drivers that power the $V_{C2}$ and $V_{CS}$ power supply lines illustrated in FIG. 6 as well other FETs used in the selection of word lines WL2 and WL3 according to the various embodiments of the present invention. PFET T30 is the PH used to select the $V_{C3}$ power supply line, while PFET T0 is the PH used to select the $V_{C2}$ power supply line. NFET T20 is the NS used to select PFET T30, while NFETs T10 and T15 are the NSs used to select PFET T0. For ease of interpretation, these components have been labeled parenthetically with their references in the relevant power supply line drivers 640 of FIG. 6.

In operation, if it is desired to activate T30 for providing power to the $V_{C3}$ power supply line, then the gate voltage GVCS<3> needs to go to ground per a word line decode signal WLDEC and a power gate not signal PGN (i.e., a signal that does not enable power gating). This allows the VCS_ROW<3> line to ramp to a full-powered voltage (e.g., 1.0 volt). In the case that it is not desired to activate the $V_{C3}$ power supply line, then T20 is de-activated per WLDEC signal being at GND, PG being at VCS and PGN at GND. If T20 is de-activated, then the drain of T30 connects to its gate, creating a short therebetween. Shorting the drain to the gate biases T30 in a diode connected configuration. For example, if VCS_ROW<3> line is at a full-power voltage (e.g., 1.0 volt) and T20 has been activated, then the gate of T30 will be at GND. For VCS_ROW<3> line to drop to a power-gated voltage (e.g., 0.7 volts), then T28 is activated and a short will occur between the drain and the gate of T30. Note that PFET T21, NFET T16 and PFET T25 also facilitate the activation and inactivation of T30 for enabling or disabling power gating.

The circuit schematic of FIG. 7 further illustrates how other operations can be performed by the power supply line drivers 640 in addition to power gating rows. For example, each power supply line driver 640 can be used to enable a deep sleep mode, which completely shuts off the header devices in order to obtain a maximum power gating (note that data in this instance will be lost). In particular, a deep sleep signal DS (i.e., a signal that enables a deep sleep mode) or a deep sleep not signal DSN (i.e., a signal that does not enable a deep sleep mode) can be used in conjunction with PHs T30 and T0. As shown in FIG. 7, the deep sleep signal DS is coupled to T20 and T10, T15 which work in conjunction with T30 and T0, respectively for power gating. If it is not desired to be in a deep sleep mode per a deep sleep not signal DSN, then PFET T27, and PFET T26 are used to prevent PHs T30 and T0, respectively, from going into a deep sleep.

In operation, if it is desired to operate in an active mode, power gate mode or a deep sleep mode then various settings of the power gate signal PG, the power gate not signal PGN, the deep sleep signal DS, and the deep sleep not signal DSN will be used to obtain the desired mode. For example, in one embodiment if it is desired to have the power supply line driver drive a power-gated mode from an active mode, then the power gate signal PG should be at $V_{CS}$ and the power gate not signal PGN should be at ground ($V_{SS}$), while the deep sleep signal DS should be at ground ($V_{SS}$) and the deep sleep not signal DSN should be at $V_{CS}$. If it is desired to be in a deep sleep mode, then the power gate signal PG should be at ground ($V_{SS}$) and the power gate not signal PGN should be at ($V_{CS}$), while the deep sleep signal DS should be at $V_{CS}$ and the deep sleep not signal DSN should be at ground ($V_{SS}$).

In some instances, it may be desirable to disable the power gating feature from happening. For example, there may be special tests that need to be performed on the memory array, and thus the leakage power savings afforded by the power gating features described herein are not necessary. In this case, the power gate signal PG should then be at ground ($V_{SS}$), the power gate not signal PGN should be at $V_{CS}$, while the deep sleep signal DS should be at ground ($V_{SS}$) and the deep sleep not signal DSN should be at $V_{CS}$.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A device, comprising:
a memory array comprising a plurality of cells arranged in rows and columns, a plurality of true bit lines each connected to a column of the memory array and a plurality of complement bit lines each forming a differential pair with, and in the same column as one of the plurality of true bit lines, a plurality of word lines each connected to a row of the memory array, a plurality of power supply lines disposed in a horizontal dimension of the memory array parallel to the plurality of word lines, each of the plurality of power supply lines shared by adjacent cells in the memory array, wherein power supply lines that activate a row selected by one of the plurality of word lines are at a full power voltage value and power supply lines that activate rows adjacent to the selected row are at a half-power voltage condition, while cells in other rows and columns in the memory array are at a power-gated voltage value.

2. The device according to claim 1, wherein the memory array comprises a plurality of ground lines disposed in a vertical dimension of the memory array parallel to the plurality of true bit lines and the plurality of complement bit lines.

3. The device according to claim 1, further comprising a plurality of word line decoders each connected to one of the plurality of word lines for selection of a row in the memory array.

4. The device according to claim 3, further comprising a plurality of near-end power supply line drivers that couple the plurality of word line decoders to one end of the plurality of power supply lines, wherein each near-end power supply line driver for a row in the memory array is selectable by a word line decoder configured to select that row and an adjacent word line decoder.

5. The device according to claim 4, wherein each near-end power supply line driver comprises a P-type field effect transistor (PFET) coupled to one of the plurality of power supply lines and a pair of N-type field effect transistors (NFETs) coupled to a gate of the PFET, wherein a first NFET couples to a word line decoder that activates a row powered by the power supply line, and a second NFET is coupled to an adjacent word line decoder.

6. The device according to claim 4, further comprising a plurality of far-end power supply line drivers each coupled to one of the plurality of power supply lines at an end opposite the coupling of the plurality of near-end power supply line drivers to the plurality of power supply lines.

7. The device according to claim 1, further comprising a plurality of word line pair pre-decoders each connected to at least one pair of word lines for selection of at least one pair of rows in the memory array and to power supply lines associated with the at least one pair of word lines.

8. The device according to claim 7, wherein the power supply lines associated with the at least one pair of word lines corresponding with odd-numbered and even-numbered rows in the memory array are selectable by a respective word line pair pre-decoder associated with the at least one pair of word lines, and wherein the even numbered power supply lines are further selectable by an adjacent word line pair pre-decoder.

9. The device according to claim 7, further comprising a plurality of power supply line drivers that couple each of the plurality of word line pair pre-decoders to the power supply lines associated with the at least one pair of word lines, wherein each word line pair pre-decoder is configured to select power supply line drivers that provide power to the power supply lines associated with the at least one pair of word lines, and power to a power supply line associated with a word line that is adjacent to the at least one pair of word lines.

10. The device according to claim 9, wherein each of the plurality of power supply line drivers comprises a PFET coupled to one of the plurality of power supply lines and at least one NFET coupled to a gate of the PFET, wherein a power supply line is selected to provide the full-power voltage value in response to the PFET being activated, and wherein an unselected power supply line provides the half-power voltage condition in response to the at least one NFET being activated, wherein the activated at least one NFET causes the gate of the PFET to short a drain of the PFET to bias the PFET to a diode connected configuration.

11. The device according to claim 10, wherein the PFET is configured to withdraw power from being provided to the power supply line in response to issuance of a deep sleep signal that enables complete shut off of the PFET.

12. The device according to claim 10, wherein the PFET and the at least one NFET are configured to provide the power-gated voltage value to the power supply line in response to issuance of a power gate signal that enables power gating of the power supply line.

13. A circuit, comprising:
a memory array comprising a plurality of cells arranged in rows and columns, a plurality of true bit lines each connected to a column of the memory array and a plurality of complement bit lines each forming a differential pair with, and in the same column as one of the plurality of true bit lines, a plurality of word lines each connected to a row of the memory array, a plurality of power supply lines disposed in a horizontal dimension of the memory array parallel to the plurality of word lines, each of the plurality of power supply lines shared by adjacent cells in the memory array; and
a fine granularity power gating device that controls a power supply provided to the plurality of power supply lines disposed in the memory array, wherein the fine granularity power gating device supplies a full-power voltage value to power supply lines to activate a row selected by one of the plurality of word lines, a half-power voltage to power supply lines to rows adjacent to the selected row, and a power-gated voltage value to power supply lines associated with the other rows in the memory array.

14. The circuit according to claim 13, further comprising a plurality of word line decoders each connected to one of the plurality of word lines for selection of a row in the memory array.

15. The circuit according to claim 14, wherein the fine granularity power gating device comprises a plurality of power supply line drivers that couple the plurality of word line decoders to one end of the plurality of power supply lines, wherein each power supply line driver for a row in the memory array is selectable by a word line decoder configured to select that row and an adjacent word line decoder.

16. The circuit according to claim 15, wherein each power supply line driver comprises a P-type field effect transistor (PFET) coupled to one of the plurality of power supply lines and a pair of N-type field effect transistors (NFETs) coupled to a gate of the PFET, wherein a first NFET couples to a word line decoder that activates a row powered by the power supply line, and a second NFET is coupled to an adjacent word line decoder.

17. The circuit according to claim 13, further comprising a plurality of word line pair pre-decoders each connected to at least one pair of word lines for selection of at least one pair of rows in the memory array and to power supply lines associated with the at least one pair of word lines.

18. The circuit according to claim 17, wherein the fine granularity power gating device comprises a plurality of power supply line drivers that couple each of the plurality of word line pair pre-decoders to the power supply lines associated with the at least one pair of word lines, wherein each word line pair pre-decoder is configured to select power supply line drivers that provide power to the power supply lines associated with the at least one pair of word lines, and power to a power supply line associated with a word line that is adjacent to the at least one pair of word lines.

19. The circuit according to claim 18, wherein the power supply lines associated with the at least one pair of word lines corresponding with odd-numbered and even-numbered rows in the memory array are selectable by a respective word line pair pre-decoder associated with the at least one pair of word lines, and wherein the even numbered power supply lines are further selectable by an adjacent word line pair pre-decoder.

20. The circuit according to claim 18, wherein each of the plurality of power supply line drivers comprises a PFET coupled to one of the plurality of power supply lines and at least one NFET coupled to a gate of the PFET, wherein the power supply line is selected to provide the full-power voltage value in response to the PFET being activated, and wherein an unselected power supply line provides the half-power voltage in response to the at least one NFET being activated, wherein the activated at least one NFET causes the gate of the PFET to short a drain of the PFET to bias the PFET to a diode connected configuration.

21. The circuit according to claim 20, wherein the PFET is configured to withdraw power from being provided to the power supply line in response to issuance of a deep sleep signal that enables complete shut off of the PFET.

22. The device according to claim 20, wherein the PFET and the at least one NFET are configured to provide the power-gated voltage value to the power supply line in response to issuance of a power gate signal that enables power gating of the power supply line.

* * * * *